(12) United States Patent
Sinangil et al.

(10) Patent No.: US 10,854,282 B2
(45) Date of Patent: *Dec. 1, 2020

(54) MEMORY READ STABILITY ENHANCEMENT WITH SHORT SEGMENTED BIT LINE ARCHITECTURE

(71) Applicant: Taiwan Semiconductor Manufacturing Co., Ltd., Hsin-Chu (TW)

(72) Inventors: Mahmut Sinangil, Campbell, CA (US); Hidehiro Fujiwara, Hsin-Chu (TW); Hung-Jen Liao, Hsin-Chu (TW); Jonathan Tsung-Yung Chang, Hsinchu (TW); Yen-Huei Chen, Jhudong Township (TW); Sahil Preet Singh, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/676,850

(22) Filed: Nov. 7, 2019

(65) Prior Publication Data

US 2020/0075092 A1 Mar. 5, 2020

Related U.S. Application Data

(63) Continuation of application No. 16/211,589, filed on Dec. 6, 2018, now Pat. No. 10,510,403, which is a (Continued)

(51) Int. Cl.
*G11C 11/419* (2006.01)
*G11C 11/412* (2006.01)
(Continued)

(52) U.S. Cl.
CPC .............. *G11C 11/419* (2013.01); *G11C 7/16* (2013.01); *G11C 7/18* (2013.01); *G11C 8/12* (2013.01);
(Continued)

(58) Field of Classification Search
CPC ....... G11C 11/419; G11C 8/12; G11C 11/412; G11C 7/16; G11C 8/16; G11C 7/18; G11C 2207/005; G11C 11/40
See application file for complete search history.

(56) References Cited

U.S. PATENT DOCUMENTS 4,794,561 A 12/1988 Hsu
5,914,906 A 6/1999 Iadanza et al.
(Continued)

OTHER PUBLICATIONS

Non-Final Office Action dated Jan. 13, 2017 for U.S. Appl. No. 15/162,711.
(Continued)

*Primary Examiner* — Gene N Auduong
(74) *Attorney, Agent, or Firm* — Eschweiler & Potashnik LLC

(57) ABSTRACT

In some embodiments, a semiconductor memory device includes an array of semiconductor memory cells arranged in rows and columns. The array includes a first segment of memory cells and a second segment of memory cells. A first pair of complementary local bit lines extend over the first segment of memory cells and is coupled to multiple memory cells along a first column within the first segment of memory cells. A second pair of complementary local bit lines extend over the second segment of memory cells and is coupled to multiple memory cells along the first column within the second segment of memory cells. A pair of switches is arranged between the first and second segments of memory cells. The pair of switches is configured to selectively couple
(Continued)

the first pair of complementary local bit lines in series with the second pair of complementary local bit lines.

20 Claims, 5 Drawing Sheets

Related U.S. Application Data continuation of application No. 15/911,824, filed on Mar. 5, 2018, now Pat. No. 10,153,038, which is a continuation of application No. 15/162,711, filed on May 24, 2016, now Pat. No. 9,922,700.

(51) Int. Cl.
    *G11C 7/16*     (2006.01)
    *G11C 7/18*     (2006.01)
    *G11C 8/12*     (2006.01)
    *G11C 8/16*     (2006.01)

(52) U.S. Cl.
    CPC .............. *G11C 8/16* (2013.01); *G11C 11/412* (2013.01); *G11C 2207/005* (2013.01)

(56) References Cited

U.S. PATENT DOCUMENTS

| | | |
|---|---|---|
| 6,023,428 A | 2/2000 | Tran |
| 6,421,294 B2 | 7/2002 | Hidaka |
| 7,630,257 B2 | 12/2009 | Madan et al. |
| 7,907,439 B2 | 3/2011 | Kushida et al. |
| 8,320,164 B2 | 11/2012 | Chuang et al. |
| 8,558,251 B2 | 10/2013 | Mitsuishi et al. |
| 8,767,470 B2 * | 7/2014 | Tanaka ................ G06F 12/0893 365/185.13 |
| 9,922,700 B2 | 3/2018 | Sinangil et al. |
| 10,153,038 B2 | 12/2018 | Sinangil et al. |
| 10,510,403 B2 * | 12/2019 | Sinangil ................... G11C 7/16 |
| 2007/0070773 A1 | 3/2007 | Houston |
| 2009/0168499 A1 | 7/2009 | Kushida et al. |
| 2012/0294088 A1 * | 11/2012 | Tanaka ................ G06F 12/0893 365/185.18 |
| 2012/0320664 A1 | 12/2012 | Shinozaki |
| 2013/0051163 A1 | 2/2013 | Koike |
| 2013/0258760 A1 | 10/2013 | Hold |

OTHER PUBLICATIONS

Final Office Action dated Jul. 27, 2017 for U.S. Appl. No. 15/162,711.
Notice of Allowance dated Oct. 31, 2017 for U.S. Appl. No. 15/162,711.
Non-Final Office Action dated Apr. 19, 2018 for U.S. Appl. No. 15/911,824.
Notice of Allowance dated Sep. 21, 2018 for U.S. Appl. No. 15/911,824.
Non-Final Office Action dated May 16, 2019 for U.S. Appl. No. 16/211,589.
Notice of Allowance dated Aug. 22, 2019 for U.S. Appl. No. 16/211,589.

* cited by examiner

MEMORY READ STABILITY ENHANCEMENT WITH SHORT SEGMENTED BIT LINE ARCHITECTURE

REFERENCE TO RELATED APPLICATIONS

This Application is a Continuation of U.S. application Ser. No. 16/211,589, filed on Dec. 6, 2018, which is a Continuation of U.S. application Ser. No. 15/911,824, filed on Mar. 5, 2018 (now U.S. Pat. No. 10,153,038, issued on Dec. 11, 2018), which is a Continuation of U.S. application Ser. No. 15/162,711, filed on May 24, 2016 (now U.S. Pat. No. 9,922,700, issued on Mar. 20, 2018). The contents of the above-referenced Patent Applications are hereby incorporated by reference in their entirety.

BACKGROUND

Semiconductor memory is an electronic data storage device, often used as computer memory and implemented on a semiconductor-based integrated circuit. Semiconductor memory is made in many different types and technologies. Semiconductor memory has much faster access times than other types of data storage technologies. For example, a byte of data can often be written to or read from semiconductor memory within a few nanoseconds, while access times for rotating storage such as hard disks is in the range of milliseconds. For these reasons, among others, semiconductor memory is used as a primary storage mechanism for computer memory to hold data the computer is currently working on, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
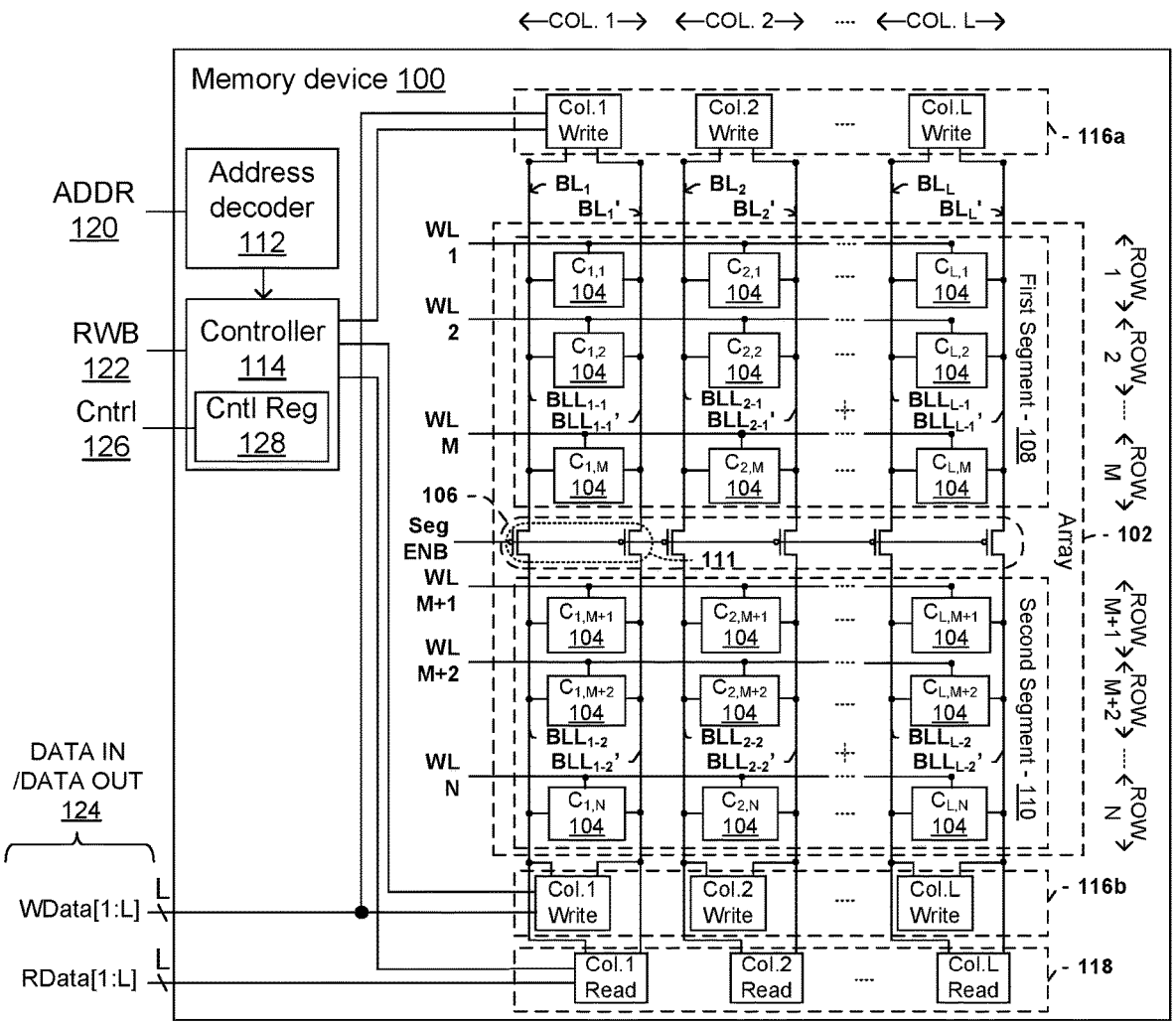
FIG. 1A illustrates a block diagram of a memory device that uses segmented bit lines according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor memory devices include a plurality of memory cells arranged in a series of rows and columns. Wordlines extend along respective rows with respective wordlines being coupled to each memory cell along respective rows; and pairs of complementary bit lines extend along respective columns with respective pairs of complementary bit lines being coupled to each memory cell along respective columns. The wordlines allow access to the memory cells on a row-by-row basis, and the complementary bit lines allow data states to be written to or read from accessed memory cells on a column-by-column basis. To conserve chip area, the complementary bit lines often run parallel to one another and are separated from one another by only a small space. As technology improves and feature sizes become smaller, adjacent complementary bit lines are becoming more closely spaced. An appreciation in the present disclosure lies in the fact that this close spacing can result in significant amount of capacitance when long complementary bit lines extend continuously along an entire column of the array. This capacitive coupling between adjacent complementary bit lines can lead to slow read and write access times, and can lead to a significant degradation of signal noise margins in memories.

FIG. 1A illustrates a block diagram of some embodiments of a memory device 100. As will be appreciated in greater detail herein, within this memory device 100, switches 106 divide complementary bit line structures into upper and lower local bitlines to limit the amount of capacitance during read and write operations.

The memory device 100 includes an array 102 of memory cells 104 which are arranged in N rows and L columns, wherein the individual memory cells 104 are labeled as $C_{COLUMN\text{-}ROW}$ for clarity in FIG. 1A. Along each row, a wordline is coupled to respective memory cells of the row. For example, in Row 1, wordline WL1 can be coupled to memory cells $C_{1,1}$ through $C_{L,1}$; in Row 2, wordline WL2 can be coupled to memory cells $C_{1,2}$ though $C_{L,2}$; and so on. Along each column, a pair of complementary bit line structures can be coupled to respective memory cells of the entire column. For example, complementary bit line structures $BL_1$, $BL_1'$ are coupled to each memory cell along Col. 1

(e.g., cells $C_{1,1}$ through $C_{1,N}$); complementary bit line structures $BL_2$, $BL_2'$ are coupled to each memory cell along Col. 2 (e.g., cells $C_{2,1}$ through $C_{2,N}$); and so on.

Switches 106 divide complementary bit line structures for each column into a first (e.g., upper) pair of local bit lines extending over a first segment 108 of the array 102, and a second (e.g., lower) pair of local bit lines extending over a second segment 110 of the array 102. The first segment 108 is made of a first group of contiguous memory cells, and a second segment 110 made of a second group of contiguous memory cells, which is separated from the first segment 108 by the switches 106 and is non-overlapping with the first segment 108. For example, in Col. 1, a first pair of switches 111 divide the complementary bit line structures $BL_1$, $BL_1'$ into a first pair of local bit lines (e.g., $BLL_{1-1}$, $BLL_{1-1'}$) and a second pair of local bit lines (e.g., $BLL_{1-2}$, $BLL_{1-2'}$). The first pair of switches 111 selectively couples and decouples the first pair of local bit lines ($BLL_{1-1}$, $BLL_{1-1'}$) in series with the second pair of local bit lines ($BLL_{1-2}$, $BLL_{1-2'}$, respectively).

In the illustrated embodiment, the switches 106 are shown as being PMOS type transistors, and the upper and lower pairs of complementary local bit lines are coupled to source/drain regions of the PMOS transistors. The upper and lower pairs of complementary local bit lines are selectively coupled together based on whether a segment enable signal (SegENB) is asserted. Although the switches 106 are illustrated as being PMOS type transistors in FIG. 1A, in other embodiments the switches 106 can be NMOS type transistors, bipolar transistors, or other types of switching devices.

To carry out read and write operations, the memory device 100 includes an address decoder 112 and a controller 114. To perform a write operation, the memory device 100 receives an address signal (ADDR 120), which specifies an address within the array 102 where data is to be written to or read from, and a read/write signal (RWB 122), which specifies whether a write operation or a read operation is to be carried out. If the operation is a write operation (e.g., RWB="0"), write data values (WDATA) are provided to the memory device 100 at a data interface 124, such as over a data bus or data port of the memory device 100. If the operation is a read operation (e.g., RWB="1"), the memory device 100 provides read data values (RDATA) to the data interface 124. An example read operation and an example write operation are now discussed in more detail with regards to FIGS. 1A-1B concurrently.

For a write operation (see write operation 150, FIG. 1B), the read/write signal (RWB 122) is provided to the memory device 100 in a first state (e.g., logical "0"), along with an address specified in the ADDR signal 120, and along with write data values WDATA. Upon receiving these signals, the controller 114 "opens" the switches 106 (see time 152, FIG. 1B), thereby decoupling the upper local complementary bit lines (e.g., $BLL_{1-1}$, $BLL_{1-1'}$) from the lower local complementary bit lines (e.g., $BLL_{1-2}$, $BLL_{1-2'}$). The address decoder 112 and controller 114 can collectively enable a wordline that corresponds to the address specified in the ADDR signal 120 (see time 154, FIG. 1B). While the specified wordline signal is enabled, other wordline signals are typically disabled, ensuring only the relevant memory cells are accessed for writing. The controller 114 can then enable write circuitry 116a or 116b to apply respective differential biases to respective local complementary bit lines to write the input data values to the accessed memory cells at the specified address (see time 156, FIG. 1B). Because the write circuitry is divided between upper segment write circuitry 116a and lower segment write circuitry 116b, the controller 114 typically enables either the upper write circuitry 116a or the lower write circuitry 116b, but not both, to save power. For example, if a write data value of ("01011000") is to be written to Row 1 in the first segment 108, the controller 114 can assert wordline WL1 and instruct the upper column write circuit 116a to apply a first differential bias to bit lines of columns where a "0" is to be written (e.g., Cols. 1, 3, and 6-8) and to apply a second, different differential bias to bit lines of columns where a "1" is to be written (e.g., Cols. 2, 4, and 5). The lower column write circuit 116b can remain off during this time, as the write operation does not pertain to the second segment 110.

Figure 1B:
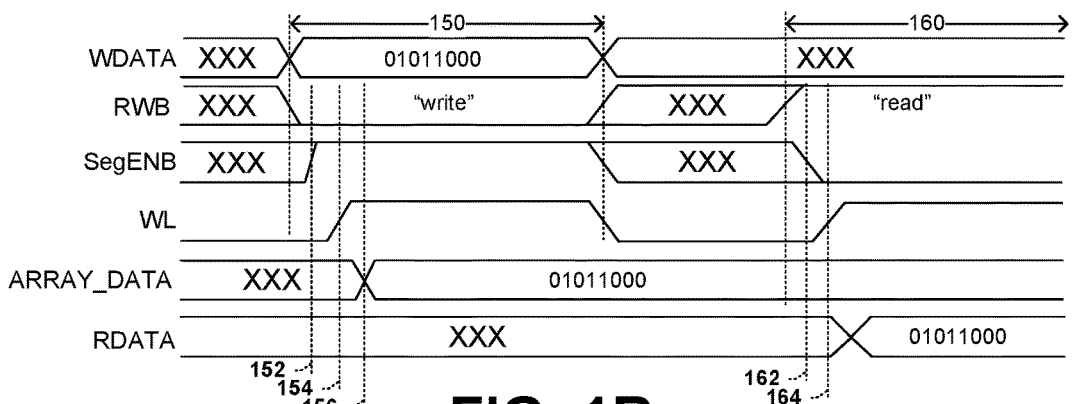
FIG. 1B illustrates an example timing diagram of a memory device according to some embodiments of the present disclosure.

By "opening" the switches 106 during this write operation 150 (which occurs when SegENB transitions to logical "1" at time 152, FIG. 1B) while the upper write circuitry 116a applies differential biases to the upper local complementary bit lines and while the lower local complementary bit lines remain substantially unbiased, faster write accesses can be achieved.

This is because the switches 106 leave the lower local complementary bit lines decoupled from the upper local complementary bit lines during the write access, such that the capacitance seen by the upper write circuitry 116a is reduced compared to if the switches 106 were not present and if the complementary bit lines were continuously coupled to every cell along an entire column (e.g., from $C_{1,1}$ to $C_{1,N}$ for Col. 1). Thus, the architecture depicted in FIG. 1A where local complementary bit lines are isolated from one another along a column by switches 106 tends to improve write speed times because the time to establish the differential bias is proportional to the resistance of the bit lines multiplied by the capacitance of the bit lines. As the capacitance of the local complementary bit lines (e.g., $BLL_{1-1}$, $BLL_{1-1'}$) is less than that of the complementary bitline structures (e.g., $BL_1$, $BL_1'$), due to the shortened segments, the write access time is correspondingly reduced, equating to faster write operations.

For a read operation (see read window operation 160, FIG. 1B), the read/write signal (RWB 122) is provided to the memory device 100 in a second state (e.g., logical "1"), and controller 114 can "close" the switches 106 (which occurs when SegENB transitions to a logical "0" at time 162, FIG. 1B) to couple the upper and lower complementary local bit lines to one another. The local bit lines are then floated, often being pre-charged to a voltage level that is between a logical "0" state and a logical "1" state. The address decoder 112 and controller 114 then collectively enable a wordline that corresponds to the address specified to be read from in the ADDR signal 120 (see time 164, FIG. 1B). The accessed cells along the wordline then leak charge onto one of the bit lines or drive a differential bias onto the pair of complementary bit lines, causing a differential bias to be established on each of the complementary bit line pairs. For example, if cell $C_{1-1}$ stores a logical "1" value and $C_{2-1}$ stores a logical "0" value, assertion of wordline WL1 can lead to a first differential bias on $BL_1/BL_1'$ (corresponding to a logical "1" which can be detected by Col. 1 read circuit in 118) and can concurrently lead to a second, different differential bias on $BL_2/BL_2'$ (corresponding to a logical "0" which can be detected by Col. 2 read circuit in 118). The biased bit lines are then coupled to the read circuitry 118, which typically includes a sense amplifier for each column. After the sense amplifiers detect the respective differential biases, the sense amplifiers then latch the corresponding data values and deliver the read data to the memory interface as output data values 124.

By providing only a single read circuit 118 for each column (rather than one read circuit for upper local bitlines and another separate read circuit for lower local bitlines), the memory architecture of FIG. 1A takes up a limited footprint and consumes less power. Thus, the switches 106 in this context not only allow faster write operations by providing segmented local bit lines with lower capacitance, but also offer good tradeoffs in that the memory device 100 can exhibit reduced power consumption and a smaller footprint than some other approaches.

It will be appreciated that although an example read operation has been described above with regards to FIG. 1A-1B, variations are contemplated as falling within the scope of this disclosure. For example, although the SegENB signal has been described as being asserted to close switches 106 and couple the upper and lower complementary local bit lines together before a wordline is asserted (see times 162, 164 in FIG. 1B), in other examples the wordline can be asserted before the SegENB signal couples the upper and lower complementary bit lines together. In other words, in this alternative approach, the SegENB signal can be asserted at a predetermined time after the wordline has been asserted. This alternative approach allows the accessed memory cells to leak charge or drive a differential bias onto shorter bit lines (e.g., solely the upper complementary bit lines rather than upper and lower complementary bit lines), which reduces the capacitance seen by the cells being read, and allows the differential bias to reach suitable voltage-levels more quickly.

In some embodiments, the time between assertion of the SegENB signal and the assertion of the wordline (difference between 162, 164, in FIG. 1B) can be programmable. Thus, SegENG signal may be a pulse which is provided to switches 106 in accordance with a programmable shape, a programmable duration, or a programmable timing, wherein a time as measured between an edge of the pulse and a neighboring edge of a wordline signal can have different values for different programmable shapes, different programmable durations, or different programmable timings of the pulse. This allows for tradeoffs to be made between capacitive loading and stability. Accordingly, in some embodiments, the controller 114 can include control registers 128 (or fuses, flash, EEPROM, or other data storage elements), which can receive control information 126, to facilitate different pulses and/or timings to be implemented. In some implementations, the pulses, durations, and/or timings can be selected from one of a pre-determined number of pulses, durations, and/or timings identified by different bit patterns of the control information 126.

Figure 2:
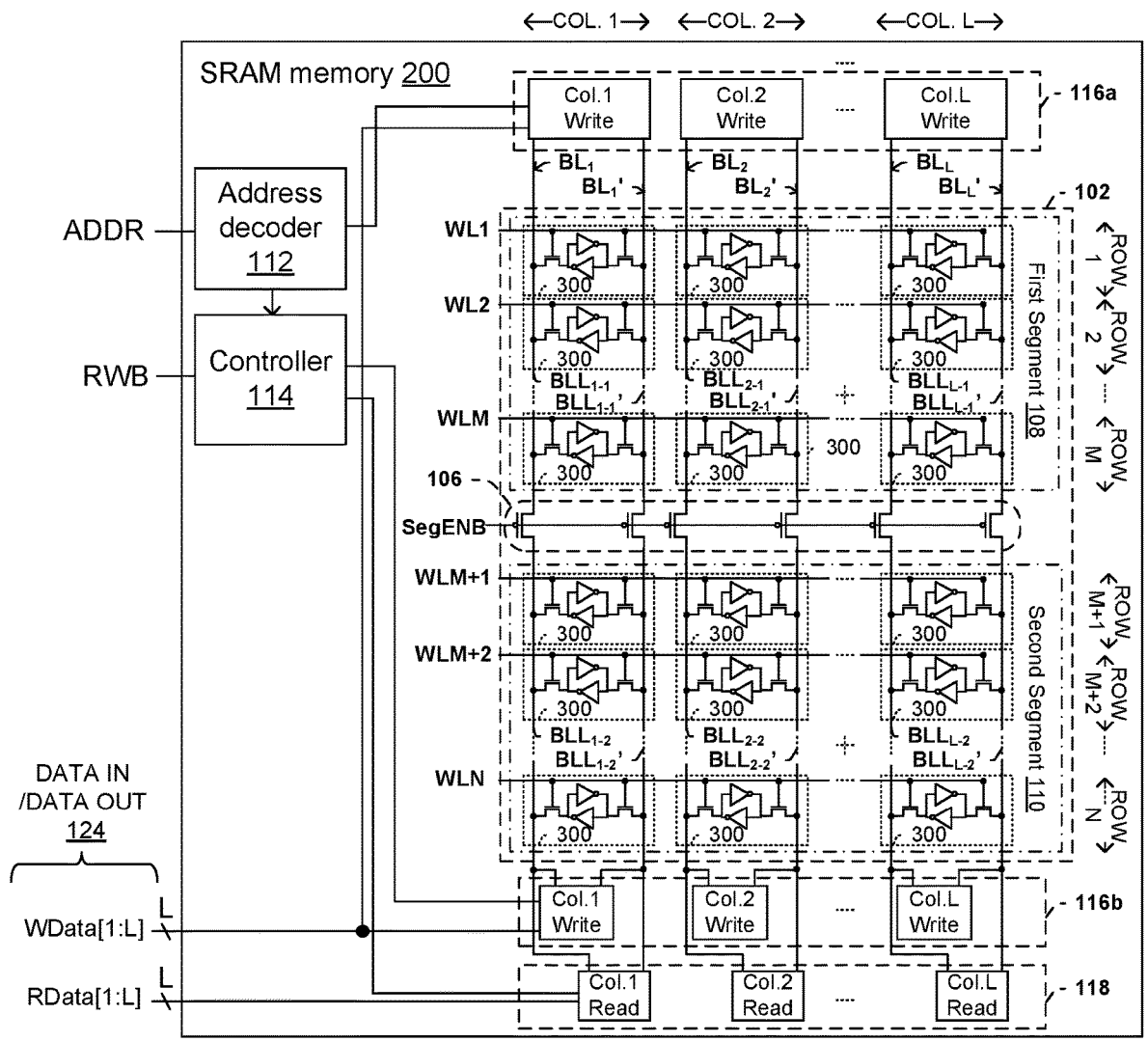
FIG. 2 illustrates a block diagram of an SRAM memory device that uses segmented bit lines according to some embodiments of the present disclosure.

FIG. 2 shows an embodiment where the memory device 100 of FIG. 1A is instantiated as a static random access memory (SRAM) device 200, made up of SRAM cells 300 arranged in columns and rows. The SRAM device 200 includes wordlines along respective rows, and complementary bitlines (e.g., $BL_1$, $BL_1'$) along respective columns (e.g., Col. 1). Switches 106 divide the complementary bitlines into upper complementary local bitlines (e.g., $BLL_{1-1}$, $BLL_{1-1}'$) and lower complementary local bitlines (e.g., $BLL_{1-2}$, $BLL_{1-2}'$). Wordlines are coupled to respective gates of access transistors for each SRAM cell along respective rows, and the upper and lower local complementary bitlines are coupled to complementary data storage nodes for each SRAM cell along respective columns.

Figure 3:
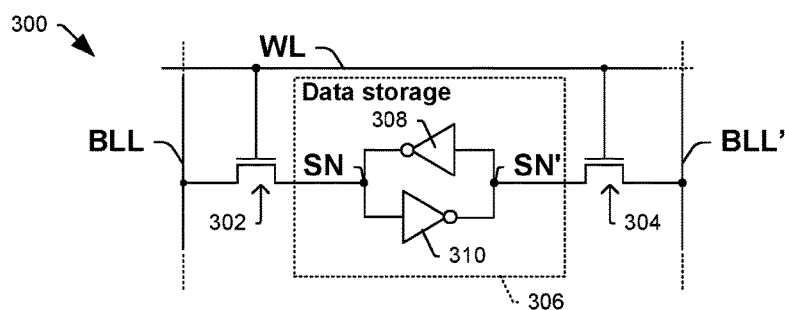
FIG. 3 illustrates an SRAM memory cell in accordance with some embodiments.

FIG. 3 depicts an SRAM cell in more detail. The SRAM cell 300 includes first and second access transistors 302, 304 and a data storage element 306. The data storage element 306 is made up of a pair of cross coupled inverters 308, 310 that are arranged to establish first and second storage nodes SN, SN'. The first and second access transistors 302, 304 have their respective sources coupled to the first and second storage nodes SN, SN', respectively, and have their respective drains coupled to first and second local complementary bit lines BLL, BLL', respectively. Because the access transistors 302, 304 provide bi-directional current flow, it will be appreciated that the terms "source" and "drain" are somewhat arbitrary here and could be exchanged. A wordline WL is coupled to the respective gate terminals of the access transistors 302, 304, wherein the wordline WL is selectively asserted to selectively couple the first and second storage nodes SN, SN' to the first and second local complementary bit lines BLL, BLL', respectively.

Although FIGS. 2-3 depict an SRAM device, it will be appreciated that these concepts are also applicable to other memory architectures. In some embodiments, other architectures, such as flash memory or dynamic random access memory (DRAM) for example, can include a single-ended bit line for each column, as opposed to the complementary bit lines shown in FIG. 1A and FIG. 2. In other embodiments, such as a DRAM or flash memory architecture where the cell has only a single bit line and no complementary bit line, the single-ended bitline is coupled to each memory cell of a column and can be paired with a reference senseline that is coupled to a reference cell or some other reference potential.

Figure 4:
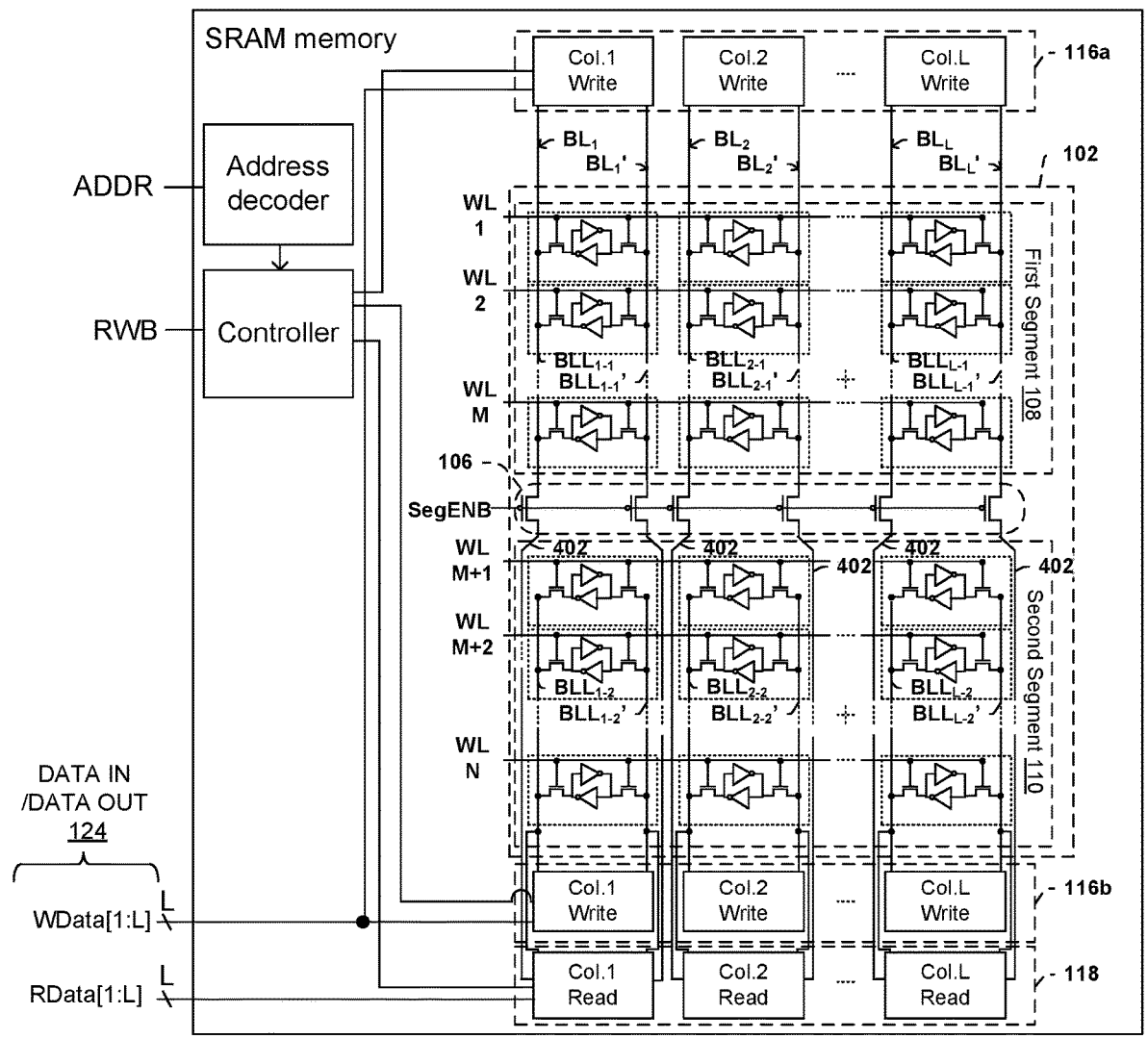
FIG. 4 illustrates a block diagram of an SRAM memory device that uses segmented bit lines and fly bit lines according to some embodiments of the present disclosure.

FIG. 4 illustrates another embodiment that employs so-called "fly" bit lines 402 extending over at least some segments of the array 102. In FIG. 4's implementation, the array 102 includes first and second segments 108, 110 which contain non-overlapping memory cells and which span multiple columns of the array 102. A first plurality of complementary local bit lines (e.g., $BLL_{1-1}$, $BLL_{1-1}'$) extend over the first segment 108, and second plurality of complementary local bit lines (e.g., fly bit lines 402) extend over the second segment 110. A plurality of switches 106 is arranged between the first and second segments 108, 110 and is configured to selectively couple the first plurality of complementary local bit lines in series with the second plurality of complementary local bit lines, respectively. Whereas the second plurality of complementary local bitlines (e.g., lower complementary local bitlines $BLL_{1-2}$, $BLL_{1-2}'$) in FIGS. 1 and 2 were coupled to the memory cells of the second segment 110, the fly bit lines 402 carry signals from the first segment 108 to the read circuitry 118 without being coupled to the memory cells of the second segment 110. A third pair of complementary local bit lines (e.g., $BLL_{1-2}$, $BLL_{1-2}'$) extend over the second segment 110 and are coupled to multiple memory cells along respective columns of the second segment 110.

A first write circuit 116a is coupled to the first plurality of complementary local bit lines (e.g., $BLL_{1-1}$, $BLL_{1-1}'$), and is configured to apply respective differential biases to the first plurality of complementary local bit lines to write data to the first segment 108. The first write circuit 116a does not to write data to the second segment 110. A second write circuit 116b is coupled to the third plurality of complementary bit lines (e.g., $BLL_{1-2}$, $BLL_{1-2}'$), and is configured to apply respective differential biases to the third plurality of complementary bit line pairs to write data to the second segment 110 but not to write data to the first segment 108.

Read circuitry 118 is configured to read data states from the first segment 108 over the first plurality of local complementary bit lines (e.g., $BLL_{1-2}$, $BLL_{1-2}'$) and over the fly bit lines 402. For example, during a read operation on the first segment 108, the SegENB can open the switches 106, and a wordline of the first segment 108 can then be asserted to leak or drive charge onto the first complementary local bitlines (e.g., $BLL_{1-1}$, $BLL_{1-1}'$). The SegENB signal can then be asserted to close the switches (with the WL still being asserted or having now been de-asserted), thereby passing the differential bias from the first plurality of local complementary bit lines (e.g., $BLL_{1-1}$, $BLL_{1-1}'$) to the fly bitlines 402. The read circuitry 118 can then sense the data states from the respective columns based on the differential biases present on the fly bitlines 402. Memory cells of the second segment 110 can be read from by asserting a wordline in the second segment 110 and then sensing the differential biases for the respective lower complementary local bitlines using the read circuitry 118. Thus, read accesses for the second segment 110 can be faster than for the first segment 108 in some embodiments.

In some embodiments, the fly bitlines 402 are disposed in a metal layer that resides at a height that is higher than that of the third plurality of complementary bit lines (e.g., $BLL_{1-2}$, $BLL_{1-2}'$). For example, the fly bitlines 402 can be disposed in a metal 2 layer, while the third plurality of complementary bitlines (e.g., $BLL_{1-2}$, $BLL_{1-2}'$) are disposed in a metal 1 layer, for example. Because the fly bitlines 402 are spaced further above the memory cells of the second segment 110 than the third plurality of complementary bit lines (e.g., $BLL_{1-2}$, $BLL_{1-2}'$), the fly bitlines 402 can offer a smaller capacitance and therefore faster read and write access times.

Figure 5A:
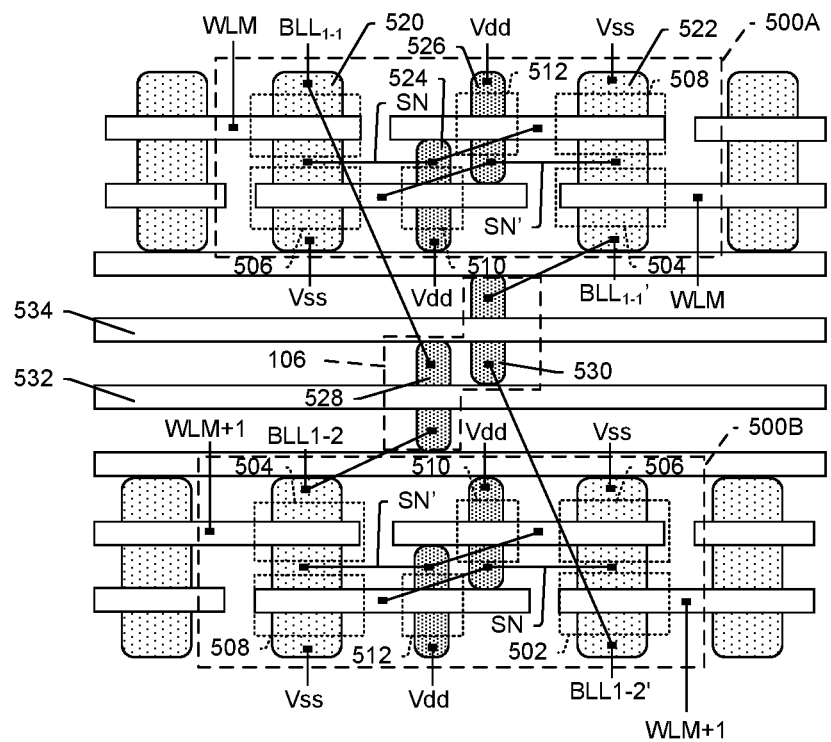
FIG. 5A illustrates some embodiments of a layout view of a memory device having segmented bit lines in accordance with some embodiments.
Figure 5B:
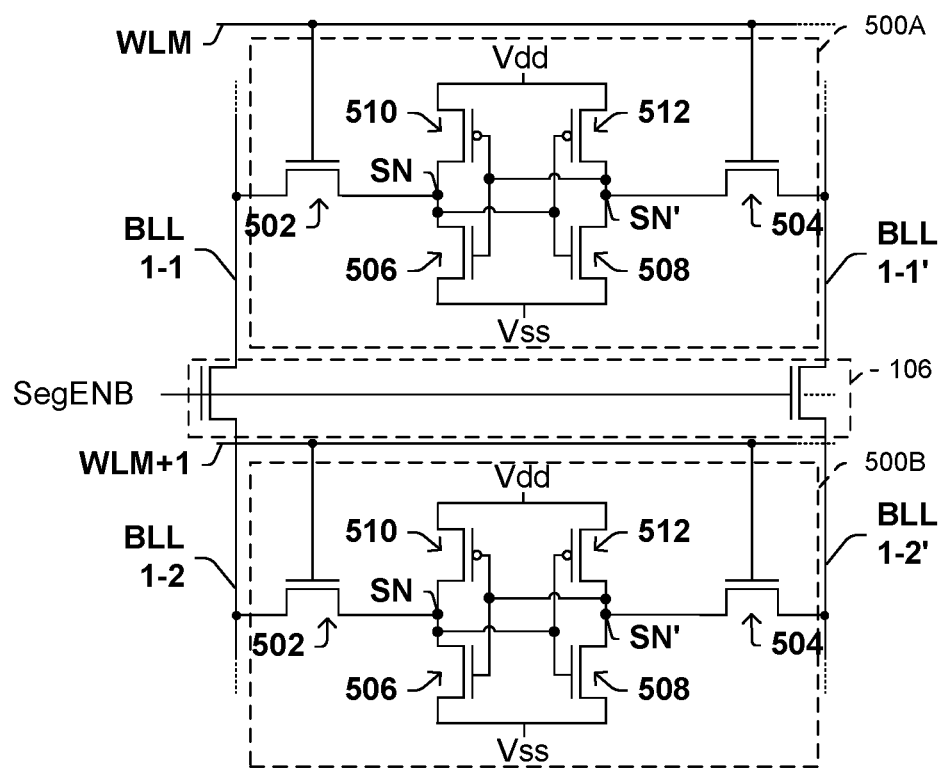
FIG. 5B illustrates some embodiments of a schematic view consistent with FIG. 5A's layout view.

FIG. 5A illustrates a layout view depicting first and second SRAM cells 500A, 500B, while FIG. 5B depicts a corresponding schematic view. In some embodiments, the SRAM cells 500A, 500B can correspond to memory cells $C_{1,M}$ and $C_{1,M+1}$ in FIG. 1A. As shown in FIGS. 5A-5B, the SRAM memory cells 500A, 500B are each made up of a pair of access transistors 502, 504, which allow selective access to complementary data storage nodes SN, SN' established by a pair of cross-coupled inverters. The cross-coupled inverters for each memory cell include two NMOS transistors 506, 508, and two PMOS transistors 510, 512. A first wordline WLM is coupled to gates of the access transistors for the first SRAM cell 500A, and a second wordline WLM+1 is coupled to gates of the access transistors for the second SRAM cell 500B. An upper pair of complementary local bitlines $BLL_{1-1}$, $BLL_{1-1}'$ extend over a first segment of memory cells which includes the first memory cell 500A, and a lower pair of complementary local bitlines $BLL_{1-2}$, $BLL_{1-2}'$ extend over a second segment of memory cells which includes the second memory cell 500B. Switches 106 couple the upper and lower complementary local bitlines to one another.

As shown in FIG. 5A, the NMOS transistors 502, 504, 506, and 508 are disposed on one or more n-type active regions 520, 522; while the PMOS transistors 510, 512 are disposed on one or more p-type active regions 524, 526. At least one of the switches 106 can have an active region layout that geometrically matches an active region layout of at least one memory cell 500A or 500B in the first or second segment, wherein the active regions are doped regions disposed in a semiconductor substrate. At least one of the switches also has a polysilicon gate or metal gate layout that geometrically matches a poly silicon gate or metal gate layout of the at least one memory cell. For example, in FIG. 5A, switches 106 have p-type active region layouts 528, 530 that each have the same geometrical shape as the active region layouts 524, 526 for PMOS transistors 510, 512, respectively; and switches 106 also have gates 532, 534 that are the same length as those of the PMOS transistors 510, 512, respectively.

Figure 6:
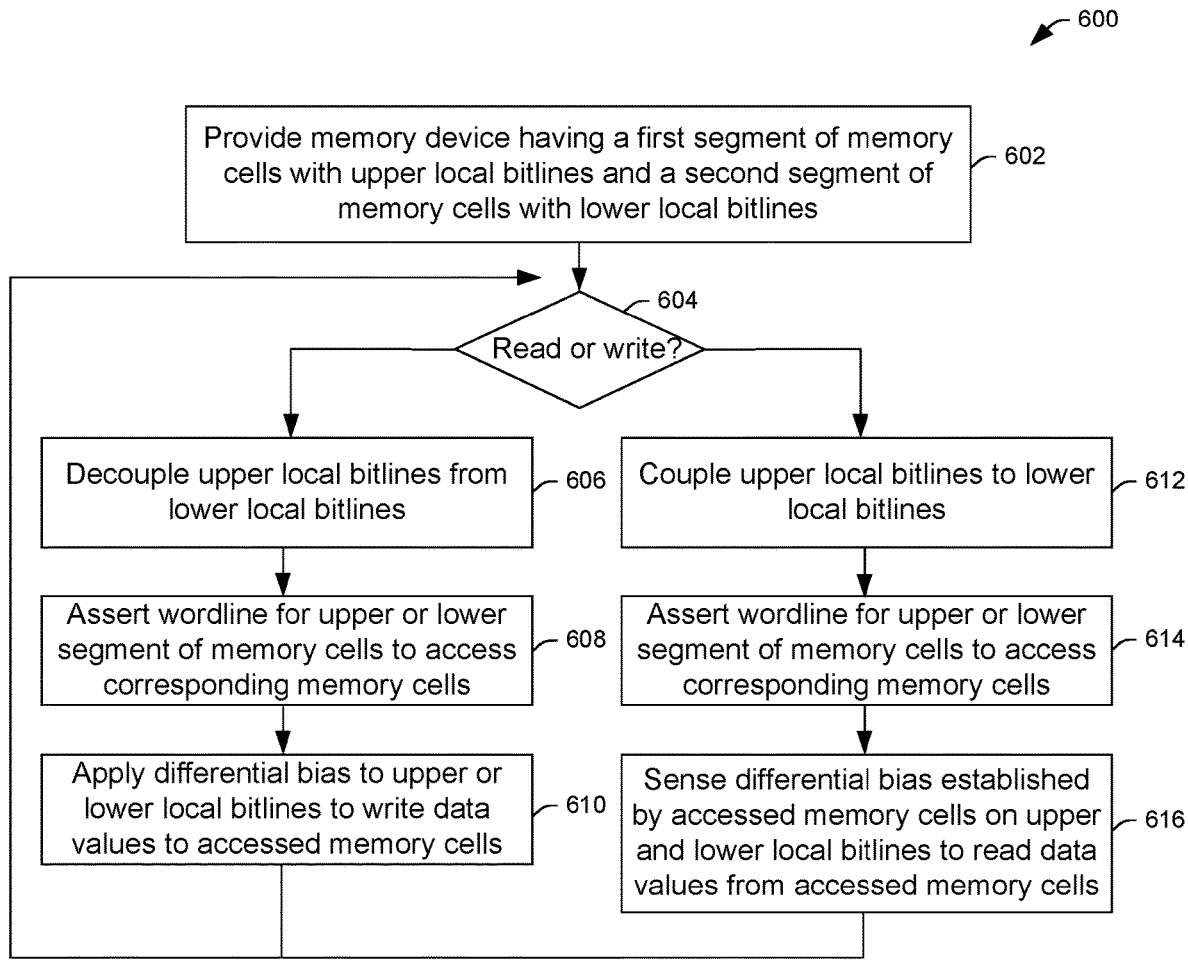
FIG. 6 illustrates a flowchart of a method of accessing a memory device in accordance with some embodiments.

With reference to FIG. 6, a flowchart of some embodiments of a method 600 for accessing a memory with local bitlines is provided.

At 602, a memory device is provided. The memory device has a first segment of memory cells with upper local bitlines, and a second segment of memory cells with lower local bitlines. Switches can selectively couple and decouple the upper and lower local bitlines to and from one another. The upper local bitlines extend over respective columns of the first segment, and the lower local bitlines extend over respective columns of the second segment. In some embodiments, the upper and lower local bitlines are disposed on the same metal layer (e.g., both upper and lower local bitlines are disposed in metal 1), while in other embodiments the upper and local bitlines can be disposed on different metal layers having different heights over a semiconductor substrate.

At 604, the method determines whether a read or write operation is to be carried out. This can be achieved, for example, by analyzing a read/write signal such as RWB signal 122 described in FIG. 1A-1B.

If a write is to be carried out ("write" at 604), at 606, the upper local bitlines are decoupled from lower local bitlines. This can be achieved, for example, by providing a segment enable signal, such as SegENB="1" as described in FIGS. 1A-1B.

At 608, a wordline for a row within the upper or lower segment of memory cells is asserted to access corresponding memory cells. This can be achieved, for example, by providing one or more wordline signals, such as WL1 through WLN described in FIGS. 1A-1B.

At 610, a differential bias is applied to upper or lower local bitlines to write data values to accessed memory cells. This can be achieved, for example, by providing using write circuitry, such as upper and/or lower write circuitry 116a, 116b as described in FIGS. 1A-1B.

If a read is to be carried out ("read" at 604), at 612, the upper local bitlines are coupled to lower local bitlines. This can be achieved, for example, by providing a segment enable signal, such as SegENB="0" as described in FIGS. 1A-1B.

At 614, a wordline for a row within an upper or lower segment of memory cells is asserted to access corresponding memory cells. This can be achieved, for example, by providing one or more wordline signals, such as WL1 through WLN described in FIGS. 1A-1B.

At 616, the accessed memory cells establish differential biases on upper and/or lower local bitlines, and read circuit senses read data values corresponding to data previously stored in the accessed memory cells. This can be achieved, for example, by providing using read circuitry, such as read circuitry 118 as described in FIGS. 1A-1B.

While the disclosed method 600 (and other illustrated and un-illustrated methods disclosed herein) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, a semiconductor memory device includes an array of semiconductor memory cells arranged in rows and columns. The array includes a first segment of memory cells and a second segment of memory cells. A first pair of complementary local bit lines extend over the first segment of memory cells and is coupled to multiple memory cells along a first column within the first segment of memory cells. A second pair of complementary local bit lines extend over the second segment of memory cells and is coupled to multiple memory cells along the first column within the second segment of memory cells. A pair of switches is arranged between the first and second segments of memory cells. The pair of switches is configured to selectively couple the first pair of complementary local bit lines in series with the second pair of complementary local bit lines.

In other embodiments, the present disclosure relates to a semiconductor memory device including an array of semiconductor memory cells arranged in rows and columns. The array includes first and second segments of non-overlapping memory cells which span multiple columns of the array. A first plurality of complementary local bit line pairs extend over the first segment of memory cells. A second plurality of complementary local bit line pairs extend over the second segment of memory cells. A plurality of switches is arranged between the first and second segments of memory cells and is configured to selectively couple the first plurality of local complementary bit line pairs in series with the second plurality of local complementary bit line pairs, respectively. A first write circuit is coupled to the first plurality of local complementary bit line pairs. The first write circuit is configured to apply respective differential biases to the first plurality of local complementary bit line pairs to write data to the first segment of memory cells but not to write data to the second segment of memory cells.

In yet another embodiment, the present disclosure relates to a static random access memory (SRAM) device including an array of SRAM cells. The array includes a first segment of SRAM cells and a second segment of SRAM cells, the first and second segments being non-overlapping with one another. A first plurality of complementary bit line pairs extend over the first segment of SRAM cells. A second plurality of complementary bit line pairs extend over the second segment of SRAM cells. A plurality of switches are arranged between the first and second segments of SRAM cells and couple the first plurality of complementary bit lines pairs in series with the second plurality of complementary bit line pairs, respectively. A first write circuit is coupled to the first plurality of complementary bit line pairs, and is configured to apply respective differential biases to the first plurality of complementary bit line pairs to write data to the first segment of SRAM cells but not write data to the second segment of SRAM cells.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with a second figure (e.g., and may even correspond to a "second dielectric layer" in the second figure), and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory device comprising:
   a first conductive line extending over a first segment of memory cells in a memory array, the first conductive line coupled to multiple memory cells within the first segment of memory cells;
   a second conductive line extending over a second segment of memory cells in the memory array, the second conductive line generally in parallel with the first conductive line and coupled to multiple memory cells within the second segment of memory cells;
   a third conductive line extending over the second segment of memory cells and generally in parallel with the first conductive line, the third conductive line isolated from the memory cells of the second segment; and
   a switch arranged between the first and second segments of memory cells and configured to selectively couple the first conductive line in series with the third conductive line.

2. The semiconductor memory device of claim 1, further comprising:
   a first write circuit coupled to the first conductive line, and configured to apply a bias to the first conductive line to write data to the first segment of memory cells.

3. The semiconductor memory device of claim 2, further comprising:
   a second write circuit separate from the first write circuit and coupled to the second conductive line, the second write circuit configured to apply a bias to the second conductive line to write data to the second segment of memory cells.

4. The semiconductor memory device of claim 1, further comprising:
   read circuitry configured to read data states from the first segment of memory cells, the read circuitry being coupled to the first conductive line through the switch and through the second conductive line.

5. The semiconductor memory device of claim 4, wherein the read circuitry is further configured to read data states from the second segment of memory cells, the read circuitry being coupled to the third conductive line.

6. The semiconductor memory device of claim 1, wherein the switch comprises a transistor, further comprising
   a memory controller configured to apply a pulse to a gate of the transistor in accordance with a programmable duration, and wherein a time measured between an edge of the pulse and a neighboring edge of a wordline signal has different values for different programmable durations.

7. The semiconductor memory device of claim 1, wherein each memory cell in the first and second segments includes a data storage node coupled to an access transistor;
  wherein the first conductive line is coupled to a first group of access transistors of a first group of memory cells in the first segment, respectively, along a first column in the first segment; and
  wherein the second conductive line is coupled to a second group access transistors of a second group of memory cells in the second segment, respectively, along the first column in the second segment.

8. The semiconductor memory device of claim 1, wherein the first segment of memory cells and the second segment of memory cells include static random access memory (SRAM) cells.

9. A semiconductor memory device comprising:
  a first conductive line extending over a first segment of memory cells in a memory array;
  a second conductive line extending over a second segment of memory cells in the memory array;
  a switch arranged between the first and second segments of memory cells and being configured to transition from an open state to a closed state to couple the first conductive line in series with the second conductive line; and
  a first write circuit coupled to the second conductive line, the first write circuit configured to apply a bias to the second conductive line while the switch is in the open state to write data to the second segment of memory cells.

10. The semiconductor memory device of claim 9, further comprising:
  a second write circuit coupled to the first conductive line, and configured to apply a bias to the first conductive line to write data to the first segment of memory cells, the first write circuit isolated from the second conductive line when the switch is in the open state such that the second write circuit does not write data to the first segment of memory cells.

11. The semiconductor memory device of claim 9, further comprising:
  read circuitry configured to read a data state from the second segment of memory cells over the second conductive line without charge corresponding to the read data state from the second segment of memory cells passing through the switch.

12. The semiconductor memory device of claim 11, wherein the read circuitry is further configured to read a data state from the first segment of memory cells through the first conductive line, through the switch, and through the second conductive line.

13. The semiconductor memory device of claim 9, further comprising:
  read circuitry is further configured to read a data state from the first segment of memory cells through the first conductive line, through the switch, and through the second conductive line.

14. The semiconductor memory device of claim 9, further comprising
  a memory controller configured to apply a pulse to the switch in accordance with a programmable timing, and wherein a time as measured between an edge of the pulse and a neighboring edge of a wordline signal has different values for different programmable timings of the pulse.

15. The semiconductor memory device of claim 9, wherein each memory cell in the first and second segments is a static random access memory (SRAM) cell including an access transistor;
  wherein the first conductive line is coupled to a first group of access transistors of a first group of memory cells in the first segment, respectively, along a first column in the first segment; and
  wherein the second conductive line is coupled to a second group access transistors of a second group of memory cells in the second segment, respectively, along the first column in the second segment.

16. A semiconductor memory device comprising:
  a first conductive line extending over a first segment of memory cells in a memory array, the first conductive line coupled to multiple memory cells within the first segment of memory cells;
  a second conductive line 402 extending over a second segment of memory cells and generally in parallel with the first conductive line, the second conductive line isolated from the memory cells of the second segment; and
  a switch 106 arranged between the first and second segments of memory cells, and configured to transition from an open state to a closed state to couple the first conductive line in series with the second conductive line; and
  wherein the semiconductor memory device is configured to develop a bias on the first conductive line when the switch is in the open state, the bias corresponding to a data state read from at least one memory cell in the first segment when the switch is in the open state.

17. The semiconductor memory device of claim 16, further comprising:
  a third conductive line extending over the second segment of memory cells in the memory array, the third conductive line generally in parallel with the second conductive line and coupled to multiple memory cells within the second segment of memory cells.

18. The semiconductor memory device of claim 17, further comprising:
  a first write circuit coupled to the first conductive line, and configured to apply a bias to the first conductive line to write data to the first segment of memory cells, the first write circuit isolated from the second conductive line such that the first write circuit does not write data to the second segment of memory cells.

19. The semiconductor memory device of claim 18, further comprising:
  a second write circuit coupled to the second conductive line, and configured to apply a bias to the second conductive line to write data to the second segment of memory cells, the second write circuit isolated from the first conductive line such that the second write circuit does not write data to the first segment of memory cells.

20. The semiconductor memory device of claim 19, further comprising:
  read circuitry configured to read a data state from the second segment of memory cells over the second conductive line but not through the switch, and further configured to read a data state from the first segment of memory cells through the first conductive line, through the switch, and through the second conductive line.

* * * * *